United States Patent
Pasotti et al.

(10) Patent No.: US 6,169,691 B1
(45) Date of Patent: Jan. 2, 2001

(54) METHOD FOR MAINTAINING THE MEMORY CONTENT OF NON-VOLATILE MEMORY CELLS

(75) Inventors: Marco Pasotti, S. Martino Siccomario; Frank Lhermet, Vimercate; Pier Luigi Rolandi, Monleale, all of (IT)

(73) Assignee: STMicroelectronics S.r.l., Agrate Brianza (IT)

(*) Notice: Under 35 U.S.C. 154(b), the term of this patent shall be extended for 0 days.

(21) Appl. No.: 09/397,387

(22) Filed: Sep. 15, 1999

(30) Foreign Application Priority Data

Sep. 15, 1998 (EP) .................................................. 98830536

(51) Int. Cl.$^7$ .................................................. G11C 16/06
(52) U.S. Cl. .................................. 365/185.25; 365/185.2; 365/222
(58) Field of Search .......................... 365/185.25, 185.2, 365/185.24, 222

(56) References Cited

U.S. PATENT DOCUMENTS

| | | | |
|---|---|---|---|
| 4,218,764 | 8/1980 | Furuta et al. | 365/222 |
| 5,818,762 * | 10/1998 | Maari et al. | 365/185.25 |
| 5,852,582 * | 12/1998 | Cleveland et al. | 365/222 |
| 5,889,698 * | 3/1999 | Miwa et al. | 365/185.03 |
| 5,950,224 * | 9/1999 | Devin | 365/185.25 X |

FOREIGN PATENT DOCUMENTS 0 791 933 A1  8/1997 (EP).

OTHER PUBLICATIONS

Takeuchi et al., "A Double–Level–$V_{th}$ Select Gate Array Architecture for Multilevel NAND Flash Memories," *IEEE Journal of Solid-State Circuits*, 31(4): 602–609, Apr. 1996.

* cited by examiner

Primary Examiner—Huan Hoang
(74) Attorney, Agent, or Firm—Theordore E. Galanthay; E. Russell Tarleton; Seed IP Law Group

(57) ABSTRACT

A method for restoring the charge lost from memory cells, such as to restore the original voltage levels, within a time equivalent to the retention time. The condition of the memory cell is determined, for example, when the memory is switched on, or based on the time elapsed since the previous programming/restoration, or based on the difference between the present threshold voltage of the reference cells and the original threshold voltage of the (suitably stored) reference cells, or when predetermined operating conditions occur. This makes it possible to prolong the life of nonvolatile memories, in particular of multilevel type, wherein the retention time decreases as the number of levels (bits/cell) is increased.

20 Claims, 3 Drawing Sheets

METHOD FOR MAINTAINING THE MEMORY CONTENT OF NON-VOLATILE MEMORY CELLS

TECHNICAL FIELD

The present invention relates to a method for maintaining the memory content of non-volatile memory cells, in particular flash-EEPROM cells.

BACKGROUND OF THE INVENTION

As known, the problem of charge retention in flash memory cells storing more than one bit is becoming increasingly important, as the number of levels to be stored in a single memory cell gradually increases. In general, it is found that the retention time (maximum time after which there is no longer any certainty of correctly reading the stored data) decreases when the number of levels to be stored in a single flash cell increases (see for example ISSCC'98, SA 21.2: "1M-Cell 6b/Cell Analog Flash Memory of Digital Storage", P. L. Rolandi et al., page 334). When there is one bit per cell (two levels), the existing technologies allow retention times of more than 10 years; however if there are 4 bits/cell (16 levels), even when the used reference elements are reference flash cells storing the various voltage levels such as to (obviously partially) compensate for the losses, the maximum times of use decrease to approximately 4–5 years, and to as little as approximately 6 months when there are 6 bits/cell.

FIGS. 1a and 1b show the effect of charge losses from the floating gate regions of a flash memory, in case of storing 2 bits/cell (four levels). In particular, FIG. 1a shows the distribution of the cells, i.e., the number of cells N versus the cell threshold voltage Vth for four stored levels, immediately after programming the memory, whereas FIG. 1b shows the distribution of the same cells after a time close to the retention time. As known, the charge loss modifies the cell distribution, both such as to displace towards lower threshold voltages the center of each bell-shaped curve (from voltages R1, R2, R3, R4 to voltages R1', R2', R3', R4' for the four stored levels), and to cause extension of at least some distributions. Further charge losses subsequently prevent discrimination between the various levels, and thus correct reading of the cells.

SUMMARY OF THE INVENTION

The invention provides a method for maintaining the charge stored in non-volatile memory cells, such as to allow retention of the data for long periods, even in multilevel memories.

In practice, the invention is based on the finding that as long as it is possible to read the cells correctly, it is also possible to restore the original voltage levels (including those of the reference cells), thereby eliminating the effects caused by charge losses.

Taking into consideration for example a flash memory using 4 bits/cell, having a data retention time equivalent to 5 years, if, 5 years after initial programming, a process to restore the levels is carried out, data is preserved unchanged for a further 5 years, after which it is possible to carry out the restoration process again, and prolong retention of the data for a further 5 years. This is made possible also because the analog precision used for memory reading is far greater than the stored digital precision; in fact, to store 4 bits/cell, now reading systems with precision greater than 7 bits/cell are used.

The decision concerning the moment at which the process of restoring the memory is to be carried out can be taken for example when the memory is switched on, based on various criteria:

the time elapsed since the previous programming/restoration (here the memory must receive the current data, to decide whether or not to carry out the restoration);

the difference between current reference values (current threshold voltage of the reference cells) and original reference values (original threshold voltage of the reference cells);

pre-determined operating conditions, which are detected for example by the system including the memory.

In all cases, it is advantageous to have a reference memory with a retention time far greater than that of the non-volatile data memory, such as a ROM memory, which can store virtually permanently the original reference levels to be used to be compared with the current reference and/or restoration levels. As an alternative, the threshold voltages corresponding to the various original levels can also be stored in the data memory itself in a digital manner, and they can then be used when necessary to restore all the memory cells (including the reference cells and the cells themselves that store the references).

BRIEF DESCRIPTION OF THE DRAWINGS

To assist understanding of the present invention, preferred embodiments are now described, purely by way of non-limiting example, with reference to the attached drawings, wherein.

DETAILED DESCRIPTION OF THE INVENTION

Figure 1A:
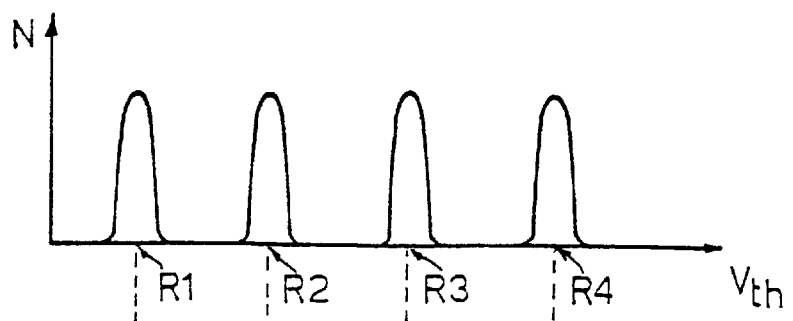
FIGS. 1a and 1b show memory cell distributions, respectively after programming, and after a time close to the retention time.
Figure 1B:
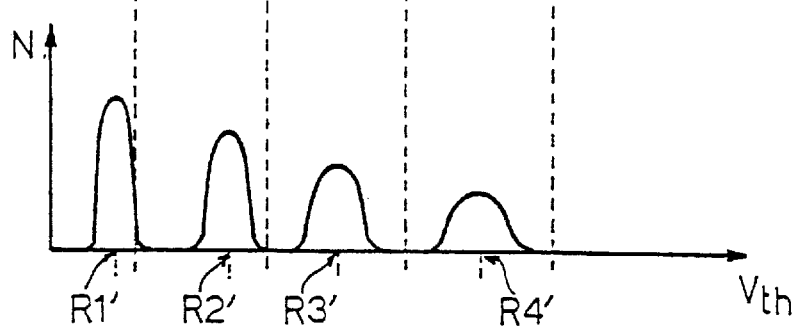
Figure 2:
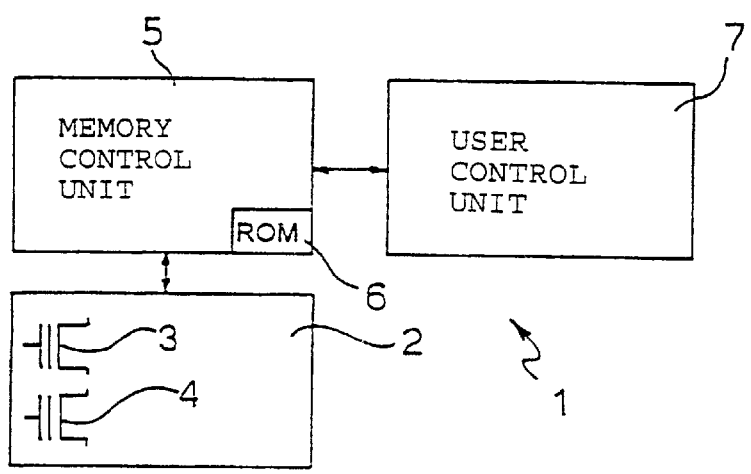
FIG. 2 shows a block diagram of a memory used in a first embodiment of the invention.

FIG. 2 shows the architecture of a memory device 1 implementing a first embodiment of the present method. The memory device 1 comprises a memory array 2, preferably of flash type, comprising a plurality of data cells 3. Memory array 2 additionally comprises reference cells 4, used for comparison reading of data cells 3. Memory array 2 is connected to a memory control unit 5, generally integrated in a single chip with the memory array 2, and comprising address circuits and management circuits of the memory array 2, in a known manner. Memory control unit 5 additionally comprises a small permanent memory (ROM memory 6), for storing the original reference levels. The memory control unit 5 is also connected to the exterior through a control unit 7 of a user.

Figure 3:
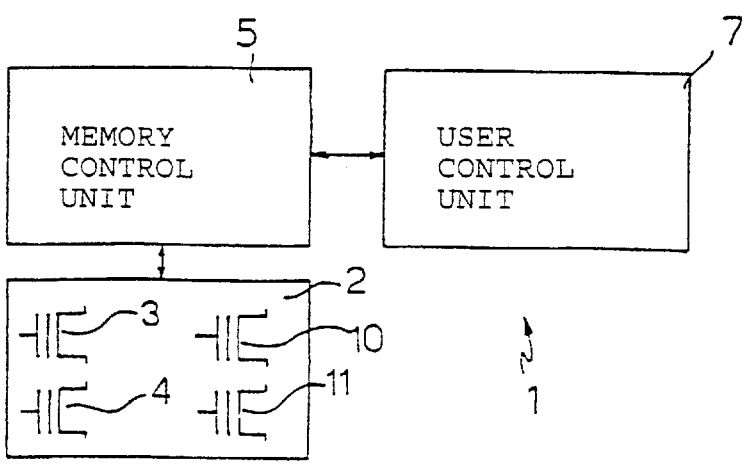
FIG. 3 shows a block diagram of a memory used in a second embodiment of the invention.

FIG. 3 shows a different architecture, wherein some data cells 3 of memory array 2, indicated at 10, store the date of the latest restoration of memory array 2, and some data cells, indicated at 11, store the original threshold voltages corresponding to the various preset digital levels. In this case, memory control unit 5 can dispense with the ROM memory for the original threshold voltages. According to another variant, not shown, memory array 2 stores, in data cells 10, only the date of the latest restoration and not the original references, and memory control unit 5 comprises a ROM memory 6 similar to that of FIG. 2.

According to an aspect of the invention, memory control unit 5 of FIGS. 2 and 3 begins a test regarding the need to carry out memory refreshing or restoration, at switching on, as described in detail hereinafter.

Figure 4:
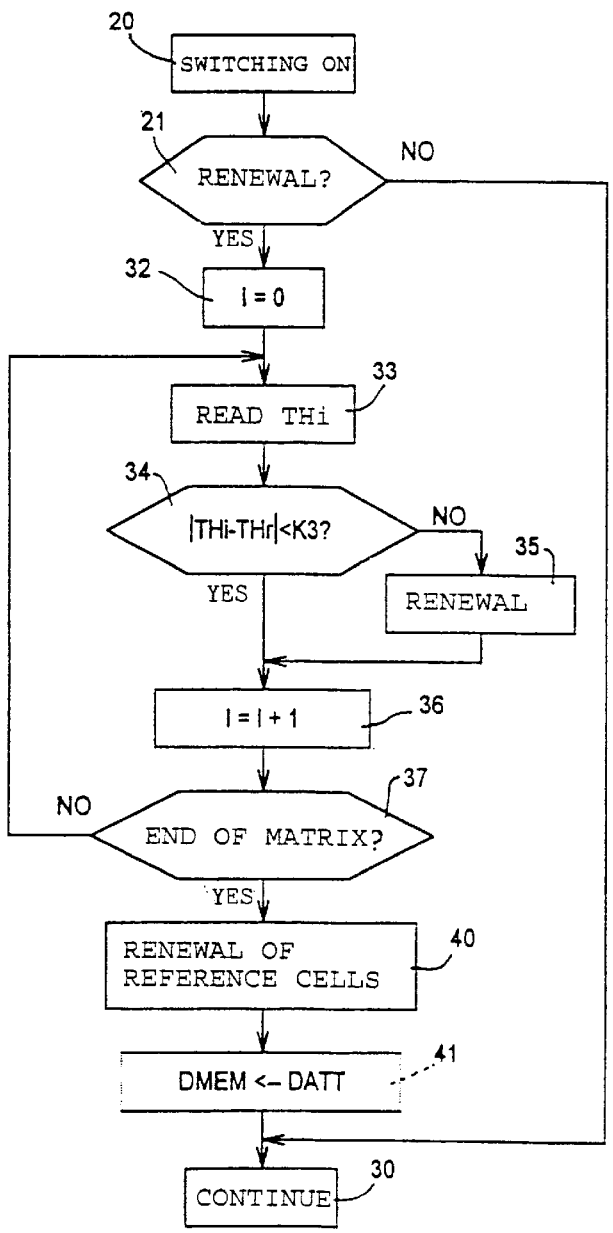
FIG. 4 shows a flow chart of the present method.
Figure 4A:
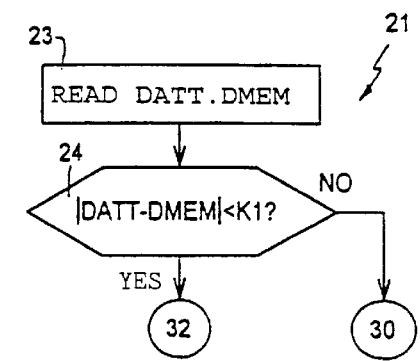
FIG. 4a shows the detail of a block in FIG. 4, according to the second embodiment of the present method.
Figure 4B:
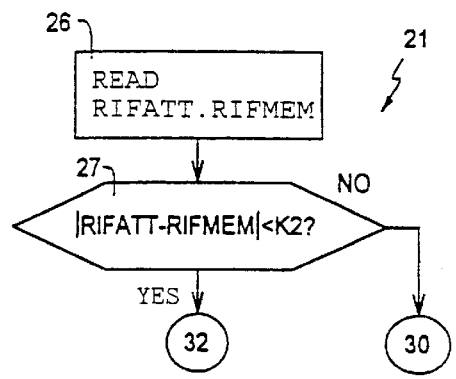
FIG. 4b shows the detail of a block in FIG. 4, according to the first embodiment of the present method.

In particular, with reference to FIG. 4, upon switching on (block 20), memory control unit 5 checks whether it is necessary to carry out refreshing, for example according to the method shown in FIG. 4a, or the method shown in FIG. 4b, block 21.

In FIG. 4a, memory control unit 5 requests from the exterior (for example from user control unit 7) the current date DATT, and reads from data cells 10 the stored date DMEM of the latest refreshing or programming, block 23. Memory control unit 5 then checks whether the difference between the current date DATT and the stored date DMEM is equal to, or greater than, a predetermined threshold value K1 (for example 5 years), block 24.

In FIG. 4b, memory control unit 5 reads the current threshold voltage RIFATT of reference cells 4 and the original threshold voltage RIFMEM from ROM memory 6 or from data cells 11, block 26. Memory control unit 5 then checks whether the difference between the current threshold voltage RIFATT and the stored threshold voltage RIFMEM, is equal to, or greater than, a predetermined threshold value K2, corresponding to the separation between the various levels, block 27.

If the result of the check in block 24 or block 27 is negative (NO outputs), no refreshing is carried out, and memory control unit 5 continues with the operations requested (block 30). On the other hand, if the result of the check in block 24 or block 27 is positive, the refreshing process is started.

The refreshing process begins with resetting an address counter I, block 32; the threshold voltage THi of the i-th data cell 3, block 33, is then read; threshold voltage THi is compared with threshold value THr corresponding to the level stored in the i-th data cell 3, block 34; if the difference between THi and Thr in absolute value exceeds a predetermined error K3, reprogramming of the i-th cell itself is carried out (block 35). The check according to block 34 is carried out to take into account any cells originally overprogrammed, which, on completion of the latest programming, had a threshold voltage greater than the reference voltage, and therefore, even after long-term charge losses, have maintained a substantially correct threshold value.

At the end of programming according to block 35, or for a NO output from block 34, counter I is incremented, block 36, and a check is made as to whether all the memory array 2 has been examined, block 37, if not (still cells to be checked and possibly reprogrammed), the method returns to block 33; if the check is positive (YES output), the reference cells are reprogrammed, block 40. Subsequently the current date is stored according to operation DMEM←DATT, if reprogramming is determined on the basis of the date of the latest programming, or if the information on the reprogramming date is to be retained for other reasons, and the operations requested by user control unit 7 are continued, block 30.

Programming according to blocks 35 and 40 must be carried out as soft programming which does not overprogram the cell. For example, use can advantageously be made of the algorithm described in European patent application 97830566.2 of Mar. 11, 1997 entitled "Method for multilevel programming of a nonvolatile memory, and a multilevel nonvolatile memory", and also referred to in the aforementioned article by Rolandi et al. This algorithm is summarized hereinafter for reference purposes.

In detail, the following algorithm is based on the fact that when a series of programming voltage pulses with a linearly increasing value is applied to the gate terminal of a non-volatile cell, at equilibrium, the threshold voltage increases in the same manner as the programming voltage. Reading the present threshold voltage of the cell to be programmed with high precision, once set the increase speed of the cell gate voltage (gradient of the ramp) based on the required threshold voltage value, the time necessary to reach the required value, and thus the number of programming pulses (of constant, predetermined duration) are determined. In practice, the number of pulses is calculated from the following equation:

$$N = (V_p - V_i)/\Delta V_G \quad (1)$$

wherein N is the number of programming pulses to be applied; $V_p$ is the required threshold voltage, $V_i$ is the initial (measured) threshold voltage, and $\Delta V_G$ is the amplitude of each programming pulse, set on the basis of the required precision.

In practice, since calculation of the number of needed pulses is correct only after equilibrium has been achieved, and considering conditions of inaccuracy, a first sequence of pulses is initially applied, to bring the cells into an equilibrium condition; a verify step is then carried out, to identify the value of the present cell threshold voltage; the number of pulses necessary to obtain the required threshold value is calculated; a number of pulses close to the number of pulses just calculated is applied, to prevent the cell from being overwritten; the present threshold value is verified out again; the number of pulses necessary to obtain the required threshold value is calculated; the number of pulses just calculated is applied; and a verify step is carried out again, optionally followed by further steps of applying programming and verify pulses.

Figure 5:
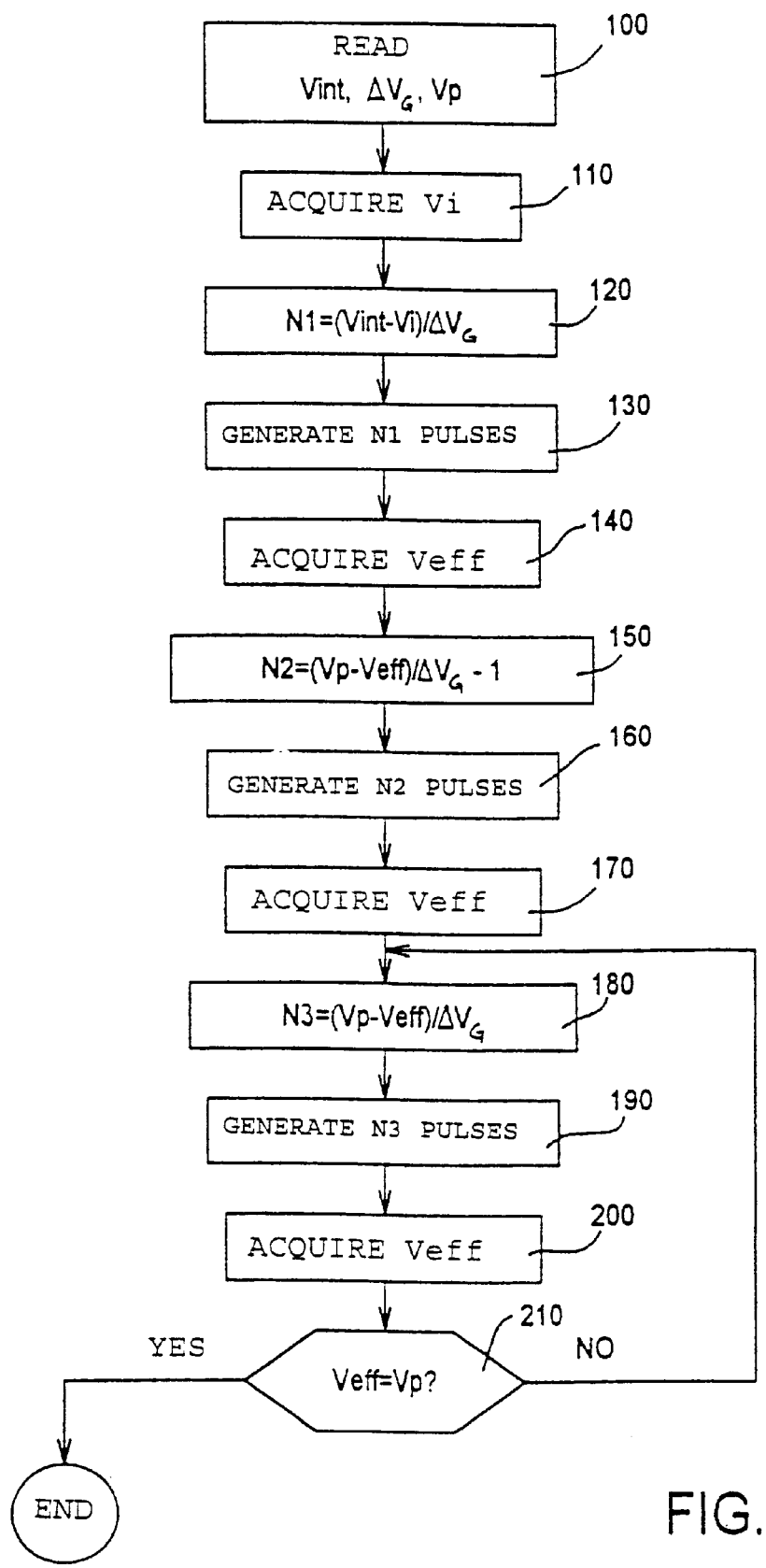
FIG. 5 shows the detail of two blocks of FIG. 4.

More specifically, with reference to FIG. 5, initially (block 100), the memory control unit reads the data necessary for programming a predetermined data cell 3 of the array. In particular, the following data are supplied: the intermediate voltage value $V_{int}$ to which the threshold voltage of the data cell 3 is to be brought to arrive into the linear zone, the amplitude $\Delta V_G$ of the programming pulses, and the required final threshold voltage $V_p$. In addition, memory control units 5 acquires the initial threshold voltage $V_i$ corresponding to the just measured value THi for data cell 3, or controls reading of the threshold voltage of reference cell 4 (block 110).

Subsequently (block 120), memory control unit 5 calculates the number of pulses N1 necessary to reach the intermediate threshold voltage $V_{int}$ on the basis of (1), and controls that N1 pulses are supplied (block 130). Subsequently, a further verify step is carried out, and the output voltage $V_{eff}$ representing the present threshold voltage of the data cell 3 (block 140) is acquired.

From the acquired value $V_{eff}$, memory control unit 5 calculates the number of pulses N2 necessary to reach the final threshold voltage $V_p$, less one, for safety (block 150), and controls supplying of the N2 pulses (block 160). A further verify step is then carried out, the value of the present threshold $V_{eff}$ is acquired (block 170), and the number of pulses N3 necessary to reach the final threshold voltage $V_p$ is calculated (block 180). The N3 pulses are applied (block 190), and a further verify step is carried out, acquiring the present threshold value $V_{eff}$ (200).

Then it is checked whether the present threshold value $V_{eff}$ is equal to the required threshold value, within the required precision level (block 210); if yes, the programming process ends; otherwise the method returns to block 180, for calculating the number of pulses still necessary to reach the threshold, and verifying.

The advantages of the described method are apparent from the preceding description. The fact is now simply emphasized that the present method can easily be implemented by memory control unit 5, which is already present in memory device 1, without requiring changes to the structure thereof.

Finally, it is apparent that many modifications and variations can be made to the method described and illustrated here, all of which come within the scope of the invention, as defined in the appended claims. In particular, although the preceding description relates to application to a flash-EEPROM memory, the present method can also be applied to other types of nonvolatile memory. In addition, the decision as to whether or not to restore the memory can depend on criteria and needs which are different from those indicated by way of example.

What is claimed is:

1. A method for maintaining the memory content of memory cells of a nonvolatile memory, the memory cells being subjected to long-term charge losses after a programming step wherein said memory cells have been programmed to predetermined threshold voltage values, comprising:
   storing data about the programmed memory cells at the time the memory cells are programmed or restored;
   reading the stored data to determine whether said memory cells require refreshing; and
   restoring said predetermined threshold voltage values when refreshing is required.

2. The method of claim 1 wherein said storing data comprises storing the date the memory cells have been last programmed or restored and checking comprises calculating the time elapsed between the date of programming and the current date, and checking whether said elapsed time is greater than a predetermined value.

3. The method of claim 2 wherein said calculating the elapsed time comprises:
   reading the stored date;
   acquiring the current date; and
   calculating the difference between said current date and the stored date.

4. The method of claim 1 wherein storing data comprises storing predetermined threshold voltage values in memory locations and checking comprises determining the difference between present threshold voltage values and the stored threshold voltage values, and checking whether said difference exceeds a predetermined value.

5. The method of claim 4 wherein said determining comprises:
   reading said predetermined threshold voltage from said memory locations;
   reading said present threshold voltage values of said memory cells; and
   calculating the difference between said predetermined threshold voltage values and said present threshold voltage values.

6. The method of claim 5, for a memory array comprising data cells and reference cells, wherein reading said present threshold values comprises reading said reference cells.

7. The method of claim 6 wherein said memory locations comprise memory cells of said memory array.

8. The method of claim 5 wherein said memory cells have a first data retention time, and said memory locations have a second data retention time that is greater than said first time.

9. The method of claim 8 wherein said memory locations belong to a ROM memory.

10. The method of claim 1 wherein restoring said predetermined threshold voltage values comprises:
    determining a present threshold voltage value of one cell of said memory cells;
    acquiring a predetermined threshold value for said one cell;
    calculating a first number of programming pulses with regularly increasing amplitude, as necessary to bring said present threshold value to said predetermined threshold value; and
    applying a second number of pulses correlated to the first number of pulses.

11. A method for maintaining the content of a nonvolatile memory cell that is subject to long-term charge losses, the method comprising:
    storing predetermined reference data regarding the nonvolatile memory cell at the time the non-volatile memory cell is programmed or refreshed to a predetermined value,
    determining the current status of the memory cell content;
    comparing the current status of the memory cell content to the predetermined reference data; and
    restoring the memory cell voltage to the predetermined value.

12. The method of claim 11 wherein the predetermined data reference is the date of programming the memory cell content, the current status is the date of determining the current status, and comparing the status of the memory cell content comprises reading the predetermined reference data and determining if the difference between the date of programming and the current date is within a predetermined value.

13. The method of claim 11 wherein the predetermined reference data is a predetermined memory cell threshold voltage level, the current status is the memory cell threshold voltage level at the time of determining the current status, and comparing the current status of the memory cell content comprises reading the predetermined memory cell threshold voltage level and determining if the difference between the predetermined memory cell threshold voltage level and the current memory cell threshold voltage level is within a predetermined value.

14. The method of claim 11 wherein the predetermined reference data is a predetermined operating condition of the memory cell, the current status is the operating condition of the memory cell at the time of determining the current status, and comparing the current status of the memory cell content comprises reading the predetermined operating condition of the memory cell and determining if the difference between the predetermined operating condition of the memory cell and the current operating condition of the memory cell is within a predetermined value.

15. The method of claim 11, wherein storing the predetermined reference data comprises storing predetermined reference data in a memory location having a data retention time greater than the retention time of the memory cell.

16. The method of claim 15 wherein the memory location of storing the predetermined reference data comprises a ROM.

17. The method of claim 15 wherein storing the predetermined reference data comprises storing the current status in digital format in a data memory cell.

18. The method of claim 11 wherein restoring the memory cell threshold voltage to a predetermined value comprises:

bringing the memory cell into an equilibrium condition;

determining a present threshold voltage level of the memory cell;

calculating a number of voltage pulses to be applied to the memory cell to increase the threshold voltage level from the present threshold voltage level to the predetermined value; and applying voltage pulses to a gate terminal of the memory cell.

19. The method of claim 18 wherein applying voltage pulses comprises applying a number of voltage pulses that is at least one less voltage pulse than the calculated number of voltage pulses.

20. The method of claim 18 wherein restoring the memory cell threshold voltage further comprises determining the memory cell threshold voltage after the application of voltage pulses to the gate of the memory cell;

calculating the number of additional voltage pulses needed to raise the memory cell threshold voltage from the present threshold voltage to the predetermined value; and applying voltage pulses to the gate of the memory cell in a number that is at least one less than the calculated number of voltage pulses.

* * * * *